(12) United States Patent
Disney

(10) Patent No.: US 8,525,268 B2
(45) Date of Patent: Sep. 3, 2013

(54) VERTICAL DISCRETE DEVICE WITH DRAIN AND GATE ELECTRODES ON THE SAME SURFACE AND METHOD FOR MAKING THE SAME

(75) Inventor: Donald R. Disney, Cupertino, CA (US)

(73) Assignee: Monolothic Power Systems, Inc., San Jose, CA (US)

( * ) Notice: Subject to any disclaimer, the term of this patent is extended or adjusted under 35 U.S.C. 154(b) by 103 days.

(21) Appl. No.: 13/022,566

(22) Filed: Feb. 7, 2011

(65) Prior Publication Data

US 2012/0199911 A1 Aug. 9, 2012

(51) Int. Cl.
*H01L 29/66* (2006.01)
(52) U.S. Cl.
USPC ............ 257/365; 257/E29.242; 257/E21.409; 438/283
(58) Field of Classification Search
USPC ................. 257/341, 342, 329, 339, 330–332, 257/337, 365, E21.409, E29.242; 438/283, 438/197
See application file for complete search history.

(56) References Cited

U.S. PATENT DOCUMENTS

| | | | |
|---|---|---|---|
| 6,259,142 B1 * | 7/2001 | Dawson et al. | 257/365 |
| 2006/0071271 A1 * | 4/2006 | Omura et al. | 257/341 |
| 2009/0224313 A1 * | 9/2009 | Burke | 257/330 |
| 2011/0291186 A1 * | 12/2011 | Yilmaz et al. | 257/334 |

* cited by examiner

*Primary Examiner* — Fernando L Toledo
*Assistant Examiner* — Victoria K Hall
(74) *Attorney, Agent, or Firm* — Perkins Coie LLP

(57) ABSTRACT

The present technology discloses a vertical discrete device with gate and drain electrodes on the same surface and method for making the same. The vertical discrete device comprises a deep gate contact that couples the buried gate to a gate electrode which is formed on the same surface as the drain electrode. The discrete device according to the present technology can be used in co-packaging power management applications and the source electrode of the discrete device may be attached to the leadframe of the package.

10 Claims, 8 Drawing Sheets

VERTICAL DISCRETE DEVICE WITH DRAIN AND GATE ELECTRODES ON THE SAME SURFACE AND METHOD FOR MAKING THE SAME

TECHNICAL FIELD

This disclosure relates generally to semiconductor devices, and particularly relates to vertical semiconductor devices with topside drain and gate contacts.

BACKGROUND

In power management applications, co-packaging an integrated circuit with a discrete semiconductor device such as a discrete power device of metal oxide semiconductor field effect transistor ("MOSFET"), junction field effect transistor ("JFET"), or other devices has become a major trend for cost and size saving. In most high voltage and/or large current power management applications, a vertical discrete transistor such as a vertical power transistor of vertical MOSFET, vertical JFET or field effect transistor ("FET") with integrated Schottky diode is often used and co-packaged with its integrated control circuit to achieve high power management performance while reducing cost and package size.

Conventionally, a semiconductor die of vertical power MOSFET, JFET, FET with an integrated Schottky diode or other vertical transistors typically comprise a drain/cathode electrode on a bottom surface and source and gate electrodes on a top surface. In many power management applications, an N-type vertical transistor is configured as a low-side switch, meaning that the source electrode is connected to the lowest potential (i.e. ground) and an electrical load is connected between the drain electrode and a higher potential (i.e. VDD). When the MOSFET is switched on and off (by modulation of the gate-source voltage), the source voltage stays relatively constant, while the drain voltage alternates between high and low voltages. Since the drain electrode is on the bottom surface of the MOSFET die, it is typically connected to the leadframe of a package. For high-power devices, the leadframe is exposed for better thermal performance. The presence of high and transitioning voltage on the exposed leadframe is often undesirable because it requires electrical isolation and can be a source of radiated electromagnetic interference ("EMI").

Prior art co-package solutions (i.e., a control chip and a vertical MOSFET in the same package) use vertical MOSFET devices that have backside drain. The high and transient voltage on the drain causes isolation and EMI problems as described above. Moreover, since the MOSFET drain is at a different voltage than the substrate of the control chip, they may not be electrically connected to the same leadframe. One prior art solution uses a non-conductive epoxy to attach the control chip to the leadframe. This provides the needed isolation, but compromises the thermal performance (i.e., the ability of the package to dissipate heat produced in the control chip). Another approach uses a special package with a split leadframe, one piece under the control chip and a separate (and isolated) piece under the MOSFET. This increases packaging cost and can complicate the attachment of the package to a print circuit ("PC") board.

SUMMARY

In one embodiment, a vertical semiconductor device comprises a substrate comprising a drain and a first surface and a second surface opposite to the first surface; an epitaxial layer formed on the first surface of the substrate and having a third surface opposite to the first surface of the substrate; a source region formed in the epitaxial layer adjacent to the third surface; a gate formed adjacent to the source region; a source electrode coupled to the source region and isolated from the gate; a drain electrode formed on the second surface of the substrate and coupled to the drain; a first gate electrode formed adjacent to the second surface of the substrate; and a deep gate contact coupling the gate to the first gate electrode. The first gate electrode is isolated from the substrate.

In another embodiment, a method of manufacturing a semiconductor device comprises providing a substrate of a first conductivity type. The substrate has a first surface and a second surface opposite to the first surface. The method also includes growing an epitaxial layer on the first surface of the substrate, and the epitaxial layer has a third surface opposite to the first surface of the substrate. The method further includes forming a gate in the epitaxial layer, forming a source region of the first conductivity type adjacent to the gate, and forming a source electrode. The source electrode is coupled to the source region and is isolated from the gate. The method yet further includes forming a drain electrode on the second surface of the substrate and forming a first gate electrode adjacent to the second surface of the substrate. The first gate electrode is isolated from the substrate. The method also includes forming a deep gate contact that couples the gate to the first gate electrode.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features.

DETAILED DESCRIPTION

Various embodiments of the technology will now be described. In the following description, some specific details, such as example circuits and example values for these circuit components, are included to provide a thorough understanding of embodiments. One skilled in the relevant art will recognize, however, that the technology can be practiced without one or more specific details, or with other methods, components, materials, etc. In other instances, well-known structures, materials, or operations are not shown or described in detail to avoid obscuring aspects of the technology.

A vertical discrete device with a source electrode on a bottom surface of the vertical discrete device die and a drain electrode and a gate electrode on the same surface is disclosed. Such a vertical discrete device allows the source electrode to be connected to the package leadframe. When the source electrode is grounded as the vertical discrete device is used as a low-side switch, an exposed leadframe may not require any special isolation and EMI may be reduced compared to conventional devices.

The terms "left," "right," "in," "out," "front," "back," "up," "down," "top," "atop", "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner.

For convenience of explanation, the present disclosure takes an N-channel vertical device manufactured on and/or in silicon semiconductor substrates for example, but this is not intended to be limiting and persons of skill in the art will understand that the structure and principles taught herein also apply to P-channel vertical devices wherein, for example, the conductivity types of the various regions shown herein are replaced by their opposites, and to other types of semiconductor materials and devices as well. While poly-silicon is preferred for filling the trenches used in embodiments of the present disclosure, the embodiments are not limited to this choice of conductor and other types of materials (e.g., metals, other semiconductors, semi-metals, and/or combinations thereof) that are compatible with other aspects of the device manufacturing process may also be used. Thus, the terms "poly-filled" and "poly-silicon filled" are intended to include such other materials and material combinations in addition to silicon.

Figure 1:
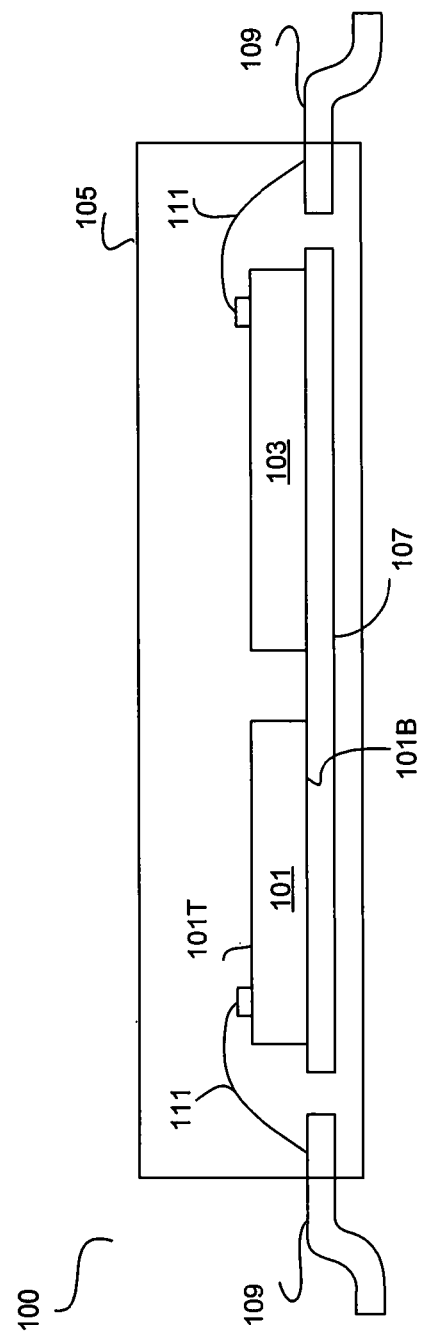
FIG. 1 shows a schematic diagram of a multi-die semiconductor device according to an embodiment of the present disclosure.

FIG. 1 illustrates a multi-die semiconductor device 100 according to one embodiment of the present disclosure. The multi-die semiconductor device 100 comprises a vertical discrete transistor die 101 and an integrated circuit die 103 that are co-packaged in one package 105. In one embodiment, the vertical discrete transistor die 101 is a power discrete transistor die such as vertical double diffused metal oxide semiconductor field effect transistor (VDMOS). The integrated circuit die 103 is one example of a control circuit for driving the vertical discrete transistor 101 on and off. The bottom surface 101B of the vertical transistor die 101 functions as a source electrode. Gate electrode formed originally on the bottom surface 101B is brought to the top surface 101T by deep trenches that are filled with a conductive material such as tungsten or highly doped polysilicon so that the gate electrode is formed on the same surface as the drain/cathode electrode.

Continuing with FIG. 1, the vertical discrete transistor die 101 and the integrated circuit die 103 are attached onto a single lead frame 107 and are connected to the leads 109 through wire bonding 111 in one embodiment. Thus, the power discrete transistor die 101 and the integrated circuit die 103 can be placed on the same lead frame 107 resulting in lower costs than conventional devices. Also, the source electrode of the power discrete transistor die 101 can be attached to the lead frame 107, and thus in applications where the source electrode is typically grounded when the vertical discrete transistor 101 is used as a low-side switch, special isolation may not be required and the lead frame 107 can be exposed with reduced risk of EMI. Also, better thermal performance can be achieved. If a single electrical signal needs be fed to the integrated circuit die 103 and to the drain of the discrete transistor die 101, the discrete transistor with the gate electrode and the drain electrode on the same surface provides top-side access to the drain of discrete transistor 101 for easy interconnection.

Figure 2A:
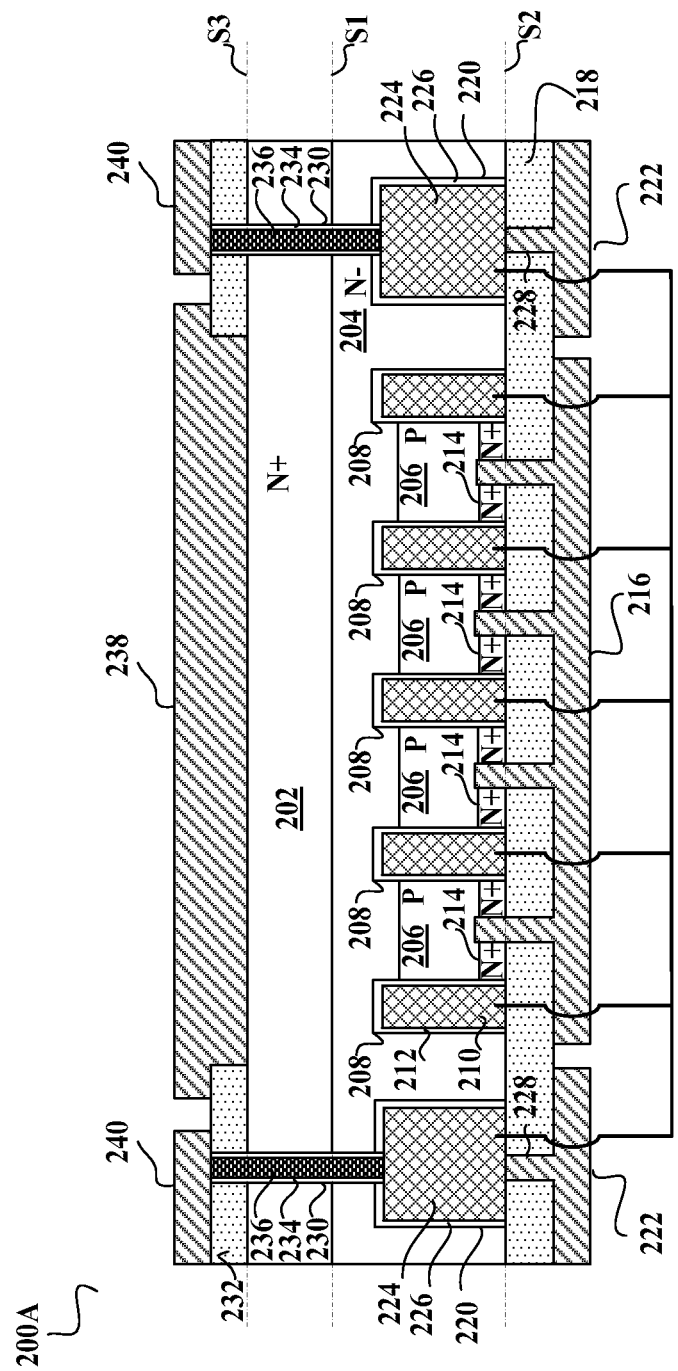
FIGS. 2A to 2C show sectional views of various vertical semiconductor devices according to an embodiment of the present disclosure.

Now refer to FIG. 2A, a sectional view of a semiconductor device 200A with drain and gate electrodes on the same surface is illustrated in accordance with one embodiment of the present technology. The semiconductor device 200A comprises a highly doped N+ substrate 202 functioning as the drain of the semiconductor device 200A, an N− epitaxial layer 204 formed on a first surface S1 of the N+ substrate 202, P type body regions 206 formed in the N− epitaxial layer 204, gate trenches 208 formed in the P type body regions 206 and the N− epitaxial layer 204 and filled with a gate 210 comprising conductive material (such as heavily-doped polysilicon) and gate oxide 212 lining the sidewalls and the bottom of the gate trenches 208 to separate the gate 210 from the P type body regions 206 and the N− epitaxial layer 204, and N+ source regions 214 formed in the P type body regions 206 adjacent the gate oxide 212. Source electrode 216 is formed of a conductive material, such as metal, on the bottom side of the semiconductor device 200A and is electrically coupled to N+ source regions 214 and P type body regions 206. Inter-level dielectric layer ("ILD") 218 is formed between the source electrode 216 and the bottom surface S2 of the epitaxial layer 204 to prevent shorting between the source electrode 216 and the gates 210.

Semiconductor device 200A further comprises gate contact trenches 220 formed in another region of the epitaxial layer 204, which are dedicated for implementing the contact between the gates 210 and the bottom side gate electrode 222. Similar to the gate trenches 208, gate contact trenches 220 are filled with a gate contact 224 comprised of conductive material such as heavily-doped polysilicon and are lined with insulating material 226 such as oxide at the walls and the bottom. In one embodiment, gate contact 224 and gate 210 comprise the same material and are formed at the same time. In one embodiment, gate oxide 212 and insulating material 226 comprise the same material and are formed at the same time. In one embodiment, gate electrode 222 extends through the dielectric layer 218 to form gate contacts 228. In one embodiment, gate contact trenches 220 are wider than the gate trenches 208 in order to simplify the formation of gate contacts 228. The depth of gate contact trenches 220 may not match that of gate trenches 208. Gate trenches 208 and gate contact trenches 220 are electrically connected such that the bottom side gate electrode 222 provides an electrical signal to gates 210. In one embodiment, gate trenches 208 and gate contact trenches 220 are connected by a transverse segment of either the gate trenches 208 or the gate contact trenches 220.

Device 200A further comprises deep trenches 230 for connecting gate contacts 224 to top side gate electrode 240, located at or near a second surface S3 of the N+ substrate 202, opposite to the first surface S1. A deep gate contact 236, comprising conductive material such as tungsten or heavily-doped polysilicon, extends through deep trench 230 and provides electrical contact between top side gate electrode 240 and gate contacts 224. A deep trench insulator 234, comprising an insulating material such as oxide, lines the walls of deep trenches 230 and electrically isolates deep gate contacts 236 from substrate 202 and epitaxial layer 204.

In one embodiment, a dielectric layer 232 is formed on the second surface S3 of the N+ substrate 202, and a metallization layer is formed on the surface of the dielectric layer 232, patterned and etched to form separate drain electrode 238 and top side gate electrode 240 on the topside surface of the semiconductor device 200A. The metallization should be chosen to provide for connection from the package to the drain electrode 238 and gate electrode 240. For example, if bond wires are used for the package connection, then the metallization used for 238 and 240 should be compatible with the wire bonding process.

Figure 2B:
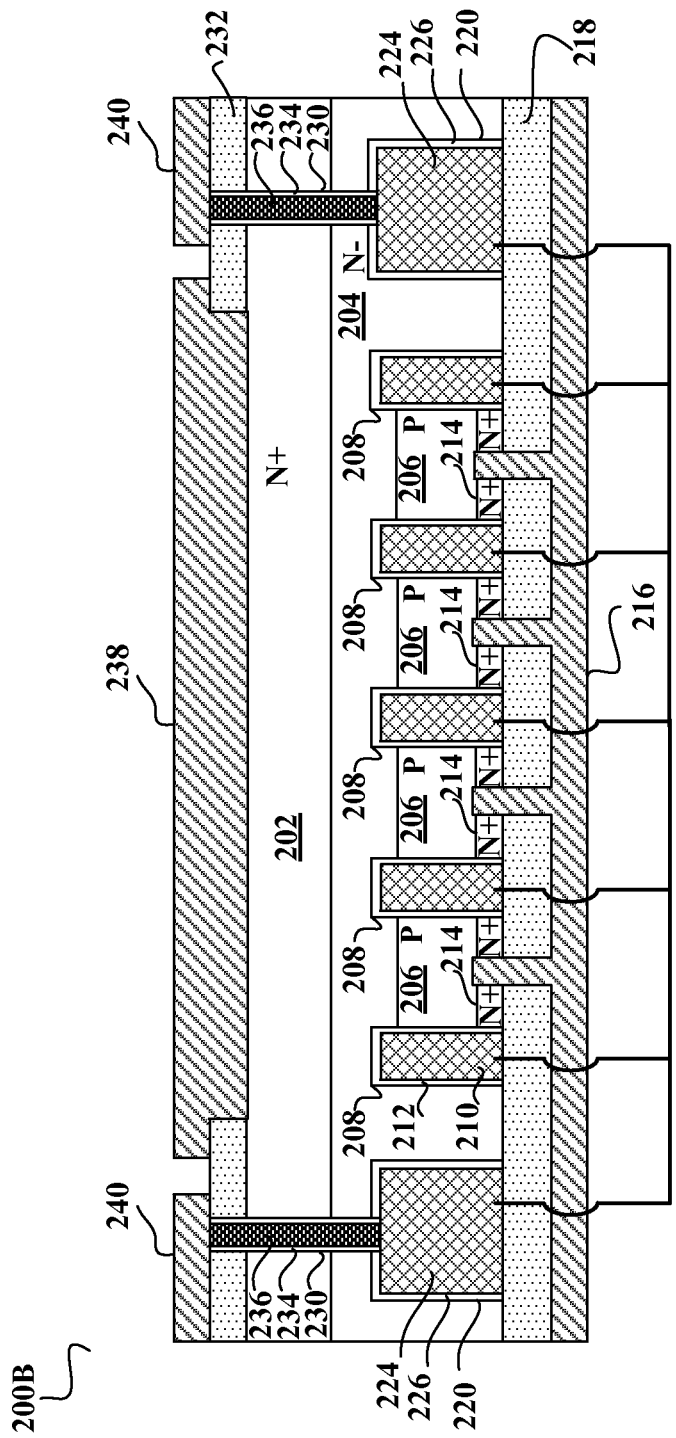
Figure 2C:
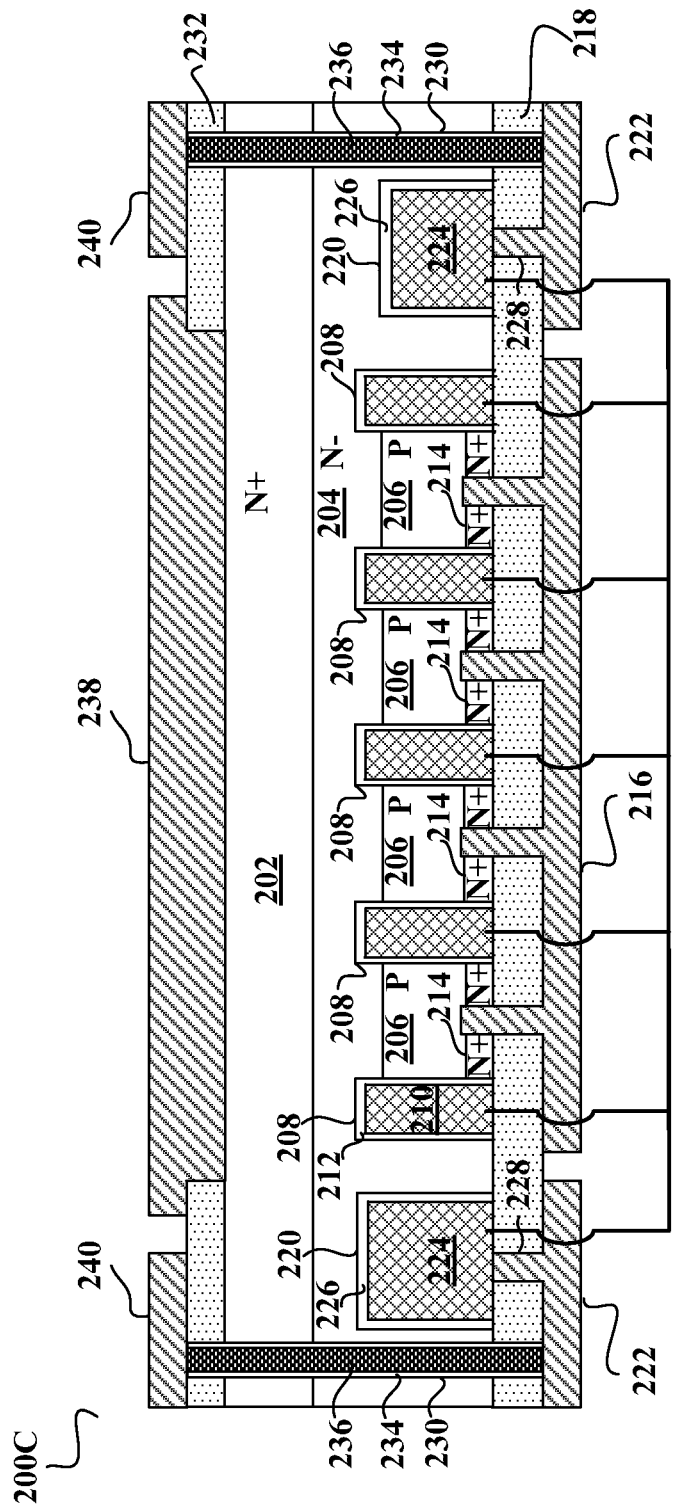

Many variants of improved vertical discrete transistors with drain and gate electrodes on the same surface can be fabricated. FIGS. 2B~2D illustrate sectional views of several embodiments in accordance with the present disclosure. In one embodiment, as illustrated in FIG. 2B, in semiconductor device 200B, the bottom side gate electrode 222 of FIG. 2A is not formed, such that the whole bottom side surface of the semiconductor device 200B can be used to form source electrode 216. In another embodiment, illustrated in FIG. 2C, a semiconductor device 200C comprises deep trenches 230 that are etched all the way through the dielectric layer 232, the N+ substrate 202, the N− epitaxial layer 204 and the dielectric layer 218 to contact the bottom side gate electrode 222.

The semiconductor devices 200A~200C illustrated respectively in FIGS. 2A~2C use a trench gate MOSFET device as an example of a semiconductor device that may be formed based on embodiments of the present technology. However, other vertical devices such as conventional planar gate MOSFET, VDMOS with thin film gate, any device with the substrate drain/cathode and source/anode and gate regions located near the top surface are also applicable to the present disclosure with deep trench contacted gate electrode on the same surface as the drain electrode.

Figure 3A:
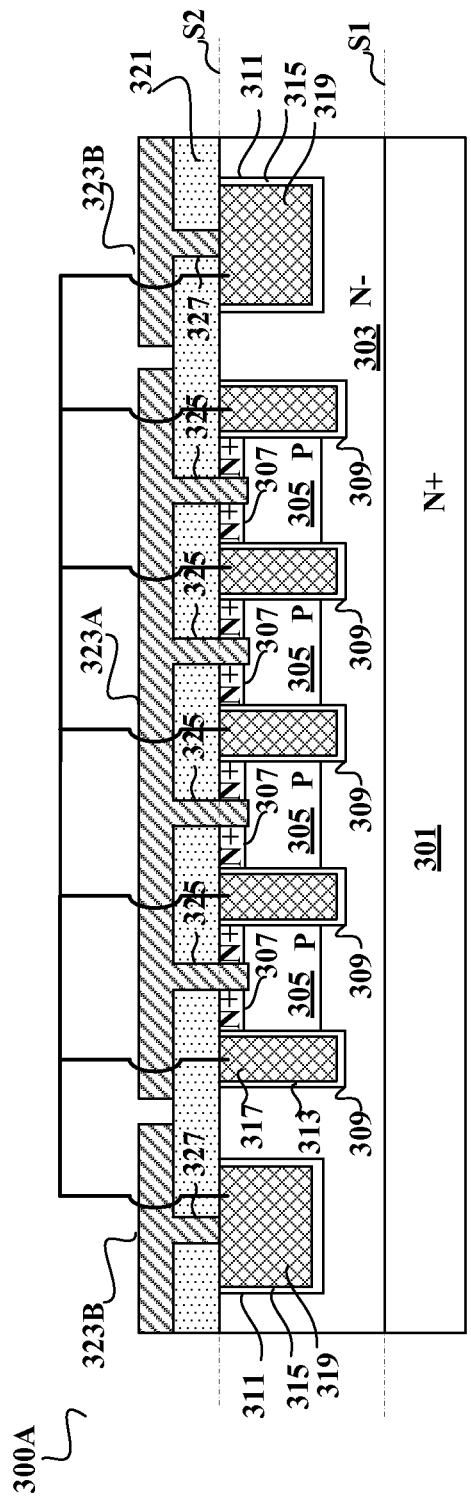
FIGS. 3A to 3D show sectional views of various vertical semiconductor devices according to another embodiment of the present disclosure.

FIGS. 3A to 3D show a fabrication process of a vertical device with drain and gate electrodes on the same surface according to one embodiment of the present disclosure. As shown in FIG. 3A, a vertical semiconductor device 300A is partially manufactured. The vertical semiconductor device 300A can be any device with a backside substrate functioning as the drain or cathode of the device, such as a vertical trench MOSFET, VDMOS, or vertical JFET.

The vertical semiconductor device 300A in FIG. 3A is illustrated as a trench gate MOSFET. In one embodiment, the MOSFET comprises a highly doped N+ substrate 301 functioning as the drain. An N− epitaxial layer 303 is grown on a first surface S1 of the N+ substrate 301. In the N− epitaxial layer 303, P type body regions 305, N+ source regions 307, gate trenches 309 and gate contact trenches 311 are formed. Gate oxide 313 is formed on the sidewalls and at the bottom of the gate trenches 309 and insulating material 315 is formed on the sidewalls and at the bottom of the gate contact trenches 311. In one embodiment, insulating material 315 is of the same material as gate oxide 313 and thus formed at the same time as the gate oxide 313. Gate 317 is formed in the gate trenches 309 and gate contact 319 is formed in the gate contact trenches 311. In one embodiment, gate 317 and gate contact 319 comprise the same material such as highly doped polysilicon and are formed at the same time. A dielectric layer 321 such as TEOS (tellurium doped glass), PSG (phosphosilicate glass), BPSG (borophosphosilicate glass) or SOG (spin-on glass) separates source electrode 323A and gate electrode 323B from the underlying body regions 305, source regions 307, and gates 317. Source contact openings 325 allow electrical contact between source electrode 323A and N+ source regions 307 and P type body regions 305. Gate contact openings 327 allow electrical contact between gate electrode 323B and gate contacts 319.

In one embodiment, manufacturing the vertical device 300A comprises: forming an N− epitaxial layer 303 on a first surface S1 of the N+ substrate 301; etching from the exposed surface S2 of the epitaxial layer 303 parallel with the first surface S1 of the N+ substrate 301 to form gate trenches 309 in the epitaxial layer 303; etching from the exposed surface S2 of the epitaxial layer 303 parallel with the first surface S1 of the N+ substrate 301 to form gate contact trenches 311 in the epitaxial layer 303 (In one embodiment, gate trenches 309 and gate contact trenches 311 are preferably etched in a same etching step); forming gate oxide 313 on the sidewalls and at the bottom of the gate trenches 309 and forming insulating material 315 on the sidewalls and at the bottom of the gate contact trenches 311 (In one embodiment, insulating material 315 is preferably of the same material as gate oxide 313 and are formed in a same step); depositing polysilicon in the gate trenches 309 to form the gate 317 and depositing conductive material in the gate contact trenches 311 to form the gate contact 319 (In one embodiment, both gate 317 and gate contact 319 are comprised of polysilicon and are formed in a same depositing step); diffusing a P type dopant to form the body regions 305, which do not extend below the bottom of the gate trenches 309 and are adjacent to the gate oxide 313; diffusing N type dopant into the P type body regions 305 at the surface area to form the N+ source regions 307; forming dielectric layer 321 on the exposed surface S2 of the epitaxial layer 303 parallel with the first surface S1 of the N+ substrate 301, i.e., atop exposed regions of the N− epitaxial layer 303, the N+ source regions 307, the gates 317 and the gate contacts 319; etching contact openings 325 and 327 through dielectric layer 321; forming a metallization layer 323 atop dielectric layer 321, the metallization layer 323 extending into contact openings 325 and 327 to contact N+ source regions 307 and gate contacts 319; and etching the metallization layer 323 to form source electrode 323A and gate electrode 323B.

Figure 3B:
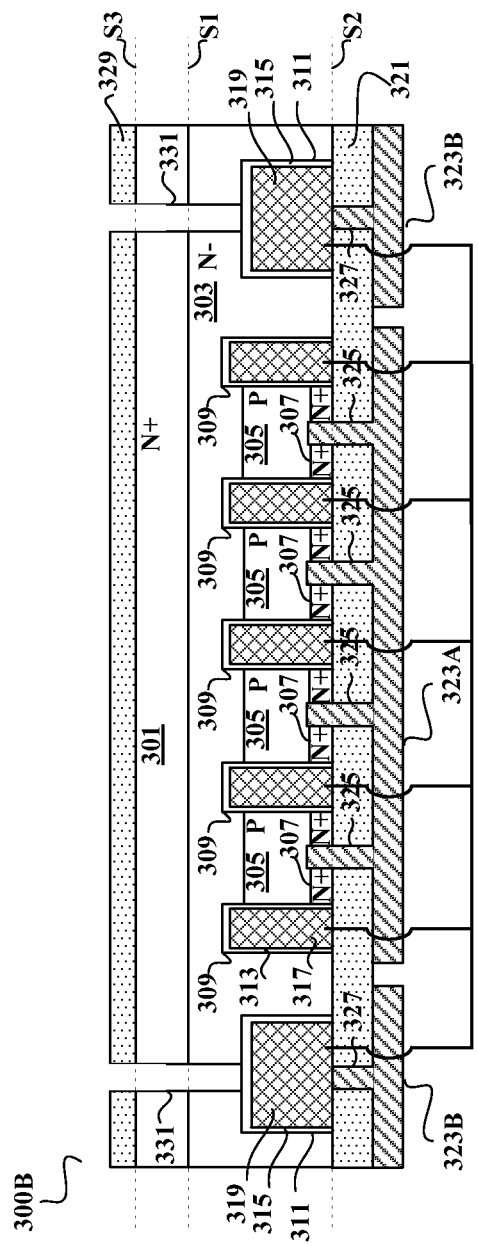

As shown in FIG. 3B, vertical device 300A is inverted by flipping over the wafer in which device 300A was constructed. N+ substrate 301 is thinned as typical for vertical semiconductor devices. In one embodiment, N+ substrate 301 is thinned to a final thickness of about 50 µm to about 150 µm. A dielectric layer 329 is deposited on a second surface S3, which is parallel to the first surface S1, of the thinned substrate 301; a mask layer is then applied to the dielectric layer 329 to define openings above the gate contact trenches 311. Using this mask layer, deep trenches 331 are etched all the way through the dielectric layer 329, the substrate 301 and the N− epitaxial layer 303, reaching the gate oxide 313. In another embodiment, a mask layer is applied to the dielectric layer 329 to define openings open in regions atop the gate electrode 323B, and deep trenches 331 are etched to reach the dielectric layer 321 at the bottom side of the vertical device. Deep trenches 331 are formed using very high aspect ratio etching process. In one embodiment, commercial etchers using a process capable of etching silicon at high rates with high aspect ratios and good selectivity to oxide are used to etch quickly through the silicon regions 301 and 303 while also stopping on the gate oxide at the bottom of the gate contact trenches 311. For example, commercial ethers are capable of etching silicon at a rate more than 10 µm per minute with aspect ratio higher than 50:1.

Figure 3C:
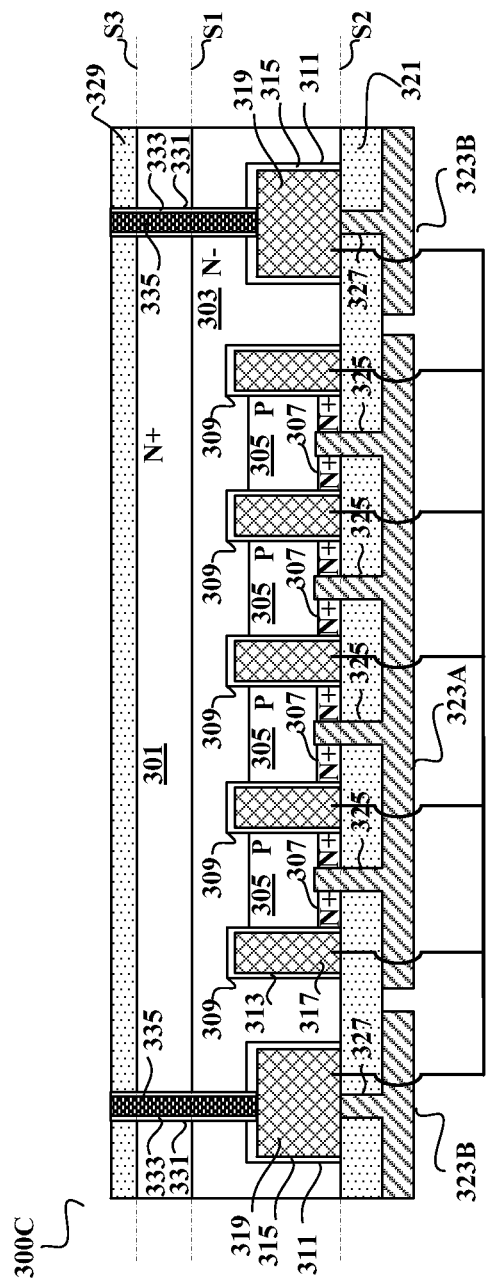

As shown in FIG. 3C, an insulating material such as oxide 333 is formed on the walls and at the bottom of deep trenches 331. The insulating material 333 at the bottom of deep trenches 331 and insulating material 315 at the bottom of gate contact trenches 311 are etched through so that deep trenches 331 reach the polysilicon gate contact 319. Deep trenches 331 are then filled with conducting material 335 such as tungsten or highly doped polysilicon. In one embodiment, conventional via filling techniques such as tungsten/polysilicon deposition and etch back are used for filling the deep trenches 331. In other embodiments, other suitable techniques may also be used for filling the deep trenched 331.

Figure 3D:
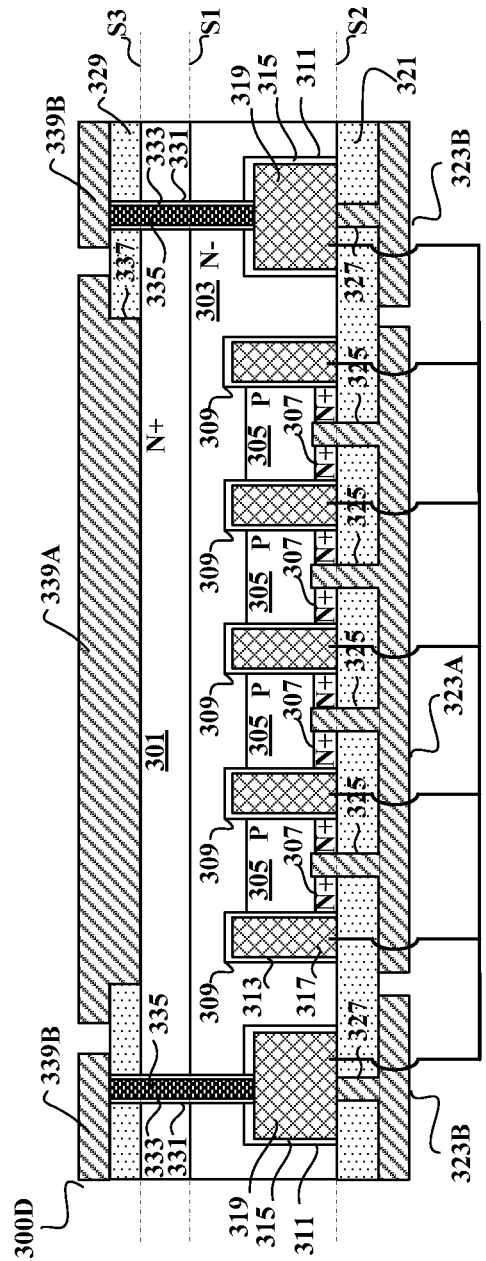

As shown in FIG. 3D, a drain contact opening 337 is formed in the dielectric layer 329 to expose the N+ substrate 301. A metallization layer is deposited on the top surface of dielectric layer 329 and extending into drain contact opening 337 to contact substrate 301. The metallization layer is etched into drain electrode 339A and gate electrode 339B. Gate electrode 339B is in electrical contact with conducting material 335 to provide an electrical signal to gate 317 (e.g. via the gate contact 319 wherein the gate 317 is electrically connected to the gate contact 319).

The devices and processes described in the present disclosure are not limited to N-channel devices. To those skilled in the art, it is well known that any vertical N-channel process can be converted to P-channel by swapping P-type and N-type dopants, and adjusting for implant range statistics with implant energies. The structures and methods of forming a vertical discrete device with top side gate and drain electrodes are therefore applicable to both N-channel and P-channel devices.

The present technology provides a vertical discrete device that includes a gate electrode on the same surface as the drain electrode. The vertical discrete device includes deep trenches that extend through a substantial portion of the thickness of the vertical discrete device die to provide contact from the gate electrodes on the same surface as the drain electrode to either the buried gate regions (formed adjacent the source structure as in conventional vertical discrete transistors) or to the gate electrode on the same surface as the source electrode.

The vertical discrete device according to the present technology may be mounted to a package leadframe with the source electrode attached to the package leadframe by a conductive epoxy, or it may comprise a solderable layer (e.g., copper or silver) to allow the source electrode to be soldered to the leadframe. The deep trenches are preferably formed using a highly anisotropic etch to form deep but narrow holes that are partially filled by an insulating material (to isolate the deep trenches from the surrounding drain material) and then the deep trenches are filled with a conductive material such as tungsten or highly doped polysilicon. In this way, a gate electrode conventionally formed on the same surface as the source electrode is brought to the surface where the drain electrode is formed. The drain electrode and gate electrode are formed of a material that allows good contact to the doped drain region of the vertical discrete device and to the conductive material which fills the deep trenches.

Vertical discrete transistors with a gate electrode on the same surface as the drain electrode are useful for high voltage and/or high current applications. Using discrete transistors of the present technology allows such discrete transistors and their controller to be placed on a same lead frame, thus reducing cost, permitting the lead frame to be exposed with reduced risk of EMI without special isolation. Also, embodiments of the semiconductor devices of the present technology can have better thermal performance and can facilitate feeding of a single power supply to the drain of the discrete transistors and their controller.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. A vertical semiconductor device, comprising:
    a substrate having a first surface and a second surface opposite the first surface;
    an epitaxial layer on the first surface of the substrate, the epitaxial layer having a fourth surface in contact with the first surface of the substrate, and a third surface opposite the fourth surface;
    a source region and a gate in the epitaxial layer and adjacent to the third surface;
    a source electrode coupled to the source region and isolated from the gate;
    a drain electrode on the second surface of the substrate;
    a first gate electrode formed adjacent to the second surface of the substrate, the first gate electrode being isolated from the substrate;
    a second gate electrode adjacent to the third surface, wherein the second gate electrode is coupled to the gate and is isolated from the source region; and
    a deep gate contact coupling the gate to the first gate electrode.

2. The vertical semiconductor device of claim 1, wherein the deep gate contact extends at least through the substrate and at least through a portion of the epitaxial layer to electrically couple the gate to the first gate electrode.

3. The vertical semiconductor device of claim 1, wherein the deep gate contact includes a deep trench having sidewalls lined with an insulating material and filled with a conductive material.

4. The vertical semiconductor device of claim 1, wherein the gate includes a plurality of gate trenches adjacent to the source region in the epitaxial layer.

5. The vertical semiconductor device of claim 4, wherein the gate trenches are lined with an insulating material on sidewalls and at a bottom of the individual gate trenches, and wherein the individual gate trenches are filled with a conductive material adjacent the insulating material.

6. The vertical semiconductor device of claim 4, further comprising a gate contact trench in the epitaxial layer, wherein the gate contact trench is coupled to the gate trenches.

7. The vertical semiconductor device of claim 6, wherein the gate contact trench is lined with an insulating material and is filled with a conductive material.

8. The vertical semiconductor device of claim 6, wherein the gate contact trench is wider than the gate trenches.

9. The vertical semiconductor device of claim 7, wherein the deep gate contact has a first end contacting the first gate electrode and a second end contacting the conductive material of the gate contact trench.

10. The vertical semiconductor device of claim 1, wherein the deep gate contact has a first end contacting the first gate electrode and a second end contacting the second gate electrode.

* * * * *